United States Patent [19]
Guzik

[11] Patent Number: 5,825,180
[45] Date of Patent: Oct. 20, 1998

[54] MAGNETIC DISK TEST APPARATUS HAVING HEADS MOVEABLE ALONG SUBSTANTIALLY PARALLEL AXES

[75] Inventor: Nahum Guzik, Palo Alto, Calif.

[73] Assignee: Guzik Technical Enterprises, San Jose, Calif.

[21] Appl. No.: 764,616

[22] Filed: Dec. 11, 1996

[51] Int. Cl.[6] ............................ G01R 33/12; B24B 39/06; B24B 49/00
[52] U.S. Cl. ............................................ 324/212; 29/90.01
[58] Field of Search ..................................... 324/210, 212, 324/262; 29/90.01, 593; 360/31, 75, 105–109

[56] References Cited

U.S. PATENT DOCUMENTS 4,902,971  2/1990  Guzik et al. ............................. 324/212
5,423,111  6/1995  Mori ........................................ 29/90.01

*Primary Examiner*—Gerard R. Strecker
*Attorney, Agent, or Firm*—Lappin & Kusmer LLP

[57] ABSTRACT

An apparatus for testing and processing a magnetic disk. The apparatus comprises a spindle for rotatably supporting the disk about a spindle axis; a first read and/or write head; a second read and/or write head; a gliding head; and a burnishing head, where the heads are selectively positionable along parallel axes overlying the magnetic disk; and a controller for selectively driving said heads across the magnetic disk and for selectively rotating the spindle in first and second directions.

43 Claims, 6 Drawing Sheets

MAGNETIC DISK TEST APPARATUS HAVING HEADS MOVEABLE ALONG SUBSTANTIALLY PARALLEL AXES

FIELD OF THE INVENTION

The present invention relates to the parametric and defect testing of magnetic media and disk drives, and specifically to an operation of certification of magnetic disks such that the locations of any and all media defects that may be present on the disk can be identified and logged.

BACKGROUND OF THE INVENTION

After manufacturing and prior to installation into disk drives, hard disks with magnetic medium for writing and reading information on concentric tracks are usually tested with regard to various defects such as non-uniformity of the medium thickness, non-coated spots where the magnetic medium is absent, or elevated areas known as bumps. During operation of a disk drive, read/write heads which read and write information on and from the disk for testing continuity of the medium are maintained over the surface of the medium in a flying position, i.e. the head floats under the effect of an air cushion created due to rotation of the disk with high speed. The flying height is normally on the order of ten to one hundred nanometers. If the bumps are present on the magnetic medium in the disk, they may collide with the magnetic head that performs reading and writing of the information on the medium. Such a collision may seriously damage the disk drive. Therefore if such bumps are present on the medium, they have to be removed or cut-off. Such a bump removing operation is known as burnishing which is performed by a blade-like burnishing head that flies at low height over the rotating disk. Prior to the burnishing the bumps are detected by a special gliding head that has a sensor, e.g. a piezo sensor that detects collisions with the bumps and registers their location.

An apparatus that performs all the above functions and tests the magnetic medium of hard disks is known as a certifier. An example of a disk certifier is a burnish/glide/certification system MC900 produced by Phase Metrics 3978 Sorrento Valley Blvd., San Diego, Calif. 92121-1418.

FIG. 1 is a top schematic view of main elements of a conventional disk certifier. The illustrated apparatus has a magnetic disk 10 which rotates in the direction of arrow W by a spindle S and is coated with a medium to be tested. Four heads are arranged circumferentially around the disk. These are writing head 12, a reading head 14, a gliding head 16, and a burnish head 18. Each head is supported by an individual head mounting mechanism 20a–20d, or an actuator which performs radial displacements of the head with respect to the disk. Because all four head mounting mechanisms are identical only one of them, e.g., actuator 20a will be described and shown. It has a stationary base plate 22 which supports a stepper motor 26 which has an output shaft 28 which is connected to a coaxially-arranged lead screw 30 which is supported by a pair of bearings 32. Lead screw 30 engages a nut 34 which is rigidly fixed to a linear slide 36. When stepper motor 26 rotates shaft 28, this rotation is converted into linear motion of slide 36. Slide 36 supports head loading mechanism 37 with head 18 supported by a mounting block 35. A head loading mechanism (not shown) either loads the head on the magnetic disk during normal head operation or unloads the head, as is well known in a prior art.

Thus the certifier shown in FIG. 1 provides a range of radial movements of magnetic heads 12, 14, 16, and 18.

Reading head 12 and writing head 14 are arranged diametrically opposite to each other at equal distances from the center of magnetic disk 10. Similarly, gliding head 16 and burnishing head 18 are arranged in diametrically opposite positions at equal distances from the center of magnetic disk 10.

Testing consists of two stages, i.e. (1) gliding and burnishing and (2) writing and reading the information on and from magnetic disk 10.

At the first stage, during rotation of magnetic disk 10, burnishing head 18 flies over the medium at a low height of about tens of manometers and removes all the elevated areas or bumps. The gliding head 16 that follows the burnishing head detects the bumps that are left after the burnishing operation for subsequent removal. Upon completion of the first stage that was used for detecting and removing surface defects, the information is written on tracks of magnetic disk 1 0 by writing head 14 and is read from the same tracks by reading head 12. As the head traverses the disk from track to track, a predetermined area of the entire surface of the magnetic medium is tested for detecting the medium defects.

The particular arrangement of four heads used in the certifier of FIG. 1 is related to the specific requirement of the head flight over a magnetic disk. The magnetic head flies over the disk only when the disk rotates in a specific direction, e.g. counterclockwise relative to the magnetic head. Therefore, heads 12, 14, 16 and 18 should be arranged in the same direction relative to the direction of the drive rotation, and, therefore, head 12 is parallel to head 14, which is in turn perpendicular to head 16. Head 16 is perpendicular to head 14 and head 12.

A disadvantage of the certifier shown in FIG. 1 is that four actuators 20a, 20b, 20c, and 20d are arranged diametrically opposite to each other in a "cross" configuration. This increases overall dimensions and weight of the certifier and also narrows a range of diameters of magnetic disks that can be tested and certified on the certifier. This is especially important in view of the latest tendency in the construction of disk drives which have small-diameter magnetic disks.

OBJECTS OF THE INVENTION

It is an object of the invention to provide a disk certifier which is compact, small in size, light in weight, and less expensive to manufacture. Other features and advantages of the present invention will be better understood after considering the ensuing specifications and drawings.

SUMMARY OF THE INVENTION

The invention is an apparatus for testing and processing a planar magnetic disk having a magnetic storage medium on a principal surface thereof. An exemplary apparatus of the invention includes a disk support assembly, two magnetic head assemblies, a glide head assembly, a burnishing head assembly and a controller.

The disk support assembly includes a spindle for rotatably supporting the magnetic disk under test about a spindle axis.

The first magnetic head assembly includes a first magnetic head and a support for selectively positioning that first magnetic head along a first head axis overlying a disk-to-tested, so that selective reading and/or writing information can be accomplished from and to the magnetic storage medium when the spindle rotates in a first direction. The first magnetic head is supported at a predetermined angle with respect to the first head axis.

The second magnetic head assembly includes a second magnetic head, a support for selectively positioning that second magnetic head along a second head axis overlying the disk-to-be-tested, so that selective reading and/or writing information can be accomplished from and to the magnetic storage medium when the spindle rotates in the first direction. The second magnetic head is supported at a predetermined angle with respect to the second head axis. That second head axis is substantially parallel to the first head axis.

The gliding head assembly includes a gliding head, and a support for selectively positioning that gliding head along a third head axis substantially parallel to the first head axis and overlying the disk, so that gliding can be accomplished by the gliding head over the magnetic storage medium when the spindle rotates in a second direction opposite the first direction.

The burnishing head assembly includes a burnishing head, and a support for selectively positioning that burnishing head along a fourth head axis substantially parallel to the first head axis and overlying the disk so that burnishing of the magnetic storage medium may be selectively accomplished by the burnishing head when the spindle rotates in the second direction.

The controller selectively drives each of the first magnetic head, the second magnetic head, the gliding head and the burnishing head across the magnetic storage medium, and selectively rotates the spindle in the first and second directions.

Typically, the magnetic disk-to-be-tested has substantially parallel circular first and second surfaces disposed symmetrically about a disk axis, where the disk axis is perpendicular to the first and second surfaces, and the disk further has a magnetic storage medium on at least the first surface.

In a preferred form, the disk support assembly includes a rotatable spindle for supporting the magnetic disk in a locus disposed about a spindle axis with the disk axis being coaxial with the spindle axis. That locus substantially corresponds in shape to the shape of the disk and has a circular first boundary region corresponding in shape and relative position to the first surface of the disk. A drive motor and associated control is adapted to rotate the spindle in each of first and second opposing disk rotation directions about the spindle axis.

The first magnetic head has an associated directed read and/or write (RW) axis. That head is supported in a head locus extending along a first head axis substantially parallel to and laterally offset a distance greater than or equal to zero in a first direction from a first radius of said first boundary region extending from the spindle axis. As a result, the first magnetic head overlies and is spaced apart a distance greater than or equal to zero from the first boundary region, and its associated RW axis is directed at least in part in the first disk rotation direction and perpendicular to or skewed by predetermined angle (A) with respect to the first radius.

The second magnetic head is similarly configured, having an associated directed RW axis, and being supported in a head locus extending along a second head axis substantially parallel to and laterally offset a distance greater than or equal to zero in a second direction from a second radius of said first boundary region extending from said first axis. As a result, the second magnetic head also overlies, and is spaced apart a distance greater than or equal to zero from, the boundary region. Its associated RW axis is directed at least in part in the first disk rotation direction and is perpendicular to or skewed by a predetermined angle (A) with respect to the second radius, where the second radius is coaxial with and oppositely directed to the second radius.

The gliding head also is supported in a head locus extending along a third head axis parallel to and laterally offset a distance greater than or equal to zero in the second direction from the first radius of the first boundary region. As a result, gliding head overlies, and is spaced apart a distance greater than or equal to zero from, the first boundary region.

The burnishing head similarly is supported in a head locus extending along a fourth head axis parallel to and laterally offset a distance greater than or equal to zero in the first direction from second radius of the first boundary region. As a result, the burnish head overlies and is spaced apart a distance greater than or equal to zero from the first boundary region.

The controller selectively drives each of the first magnetic head, the second magnetic head, the gliding head, and the burnishing head in the respective loci across the first boundary region. That motion may extend from a position distal from the spindle axis, to a position proximal to the first axis, and back to the position distal from the spindle axis, or from a position proximal to the spindle axis, to a position distal from the spindle axis, and back to a position proximal to the spindle axis.

The operation of the invention and certain characteristics and ramifications of the invention are described in detail below.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
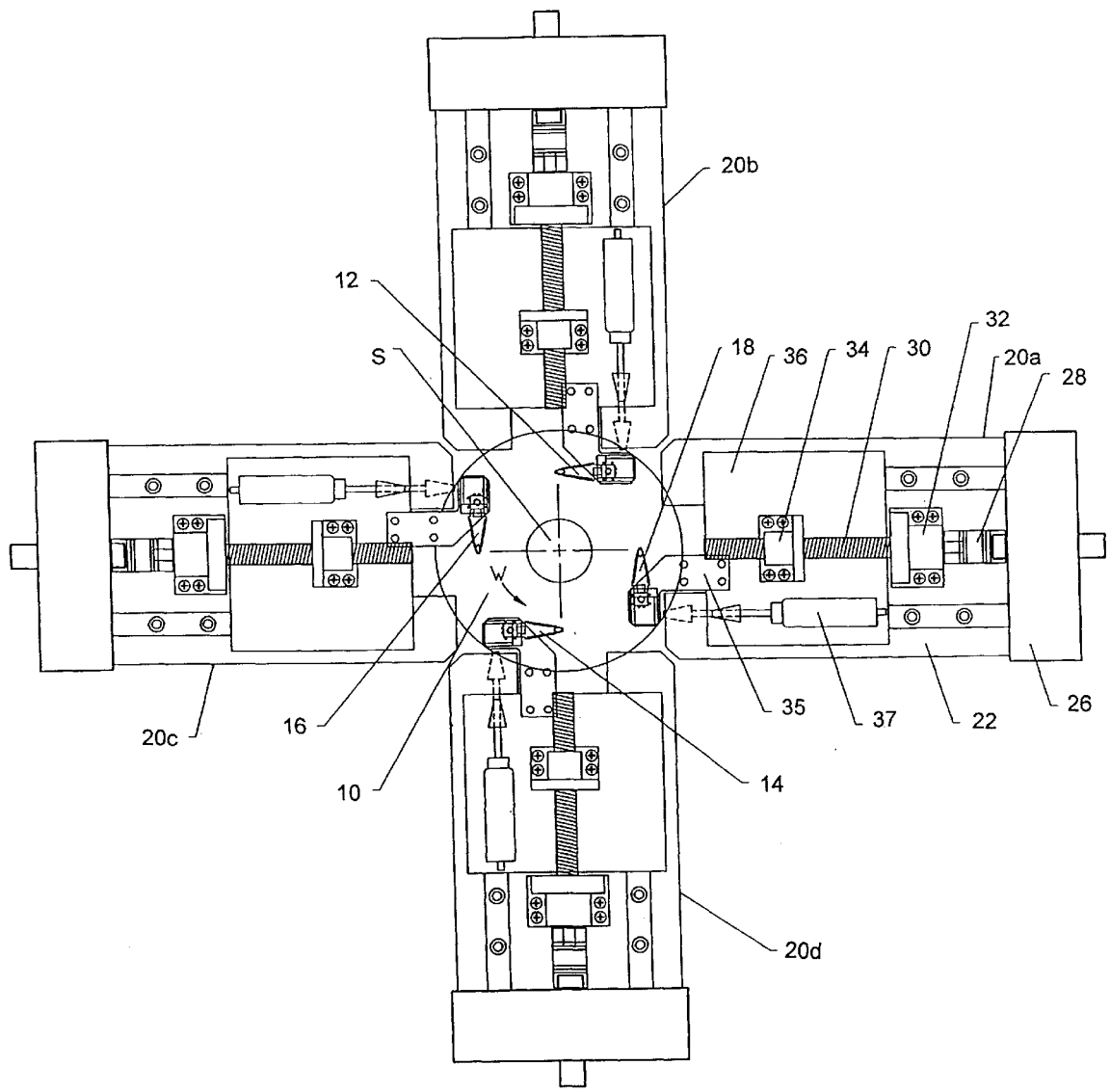
FIG. 1 is a schematic top view of a known disk certifier with four heads.
Figure 2:
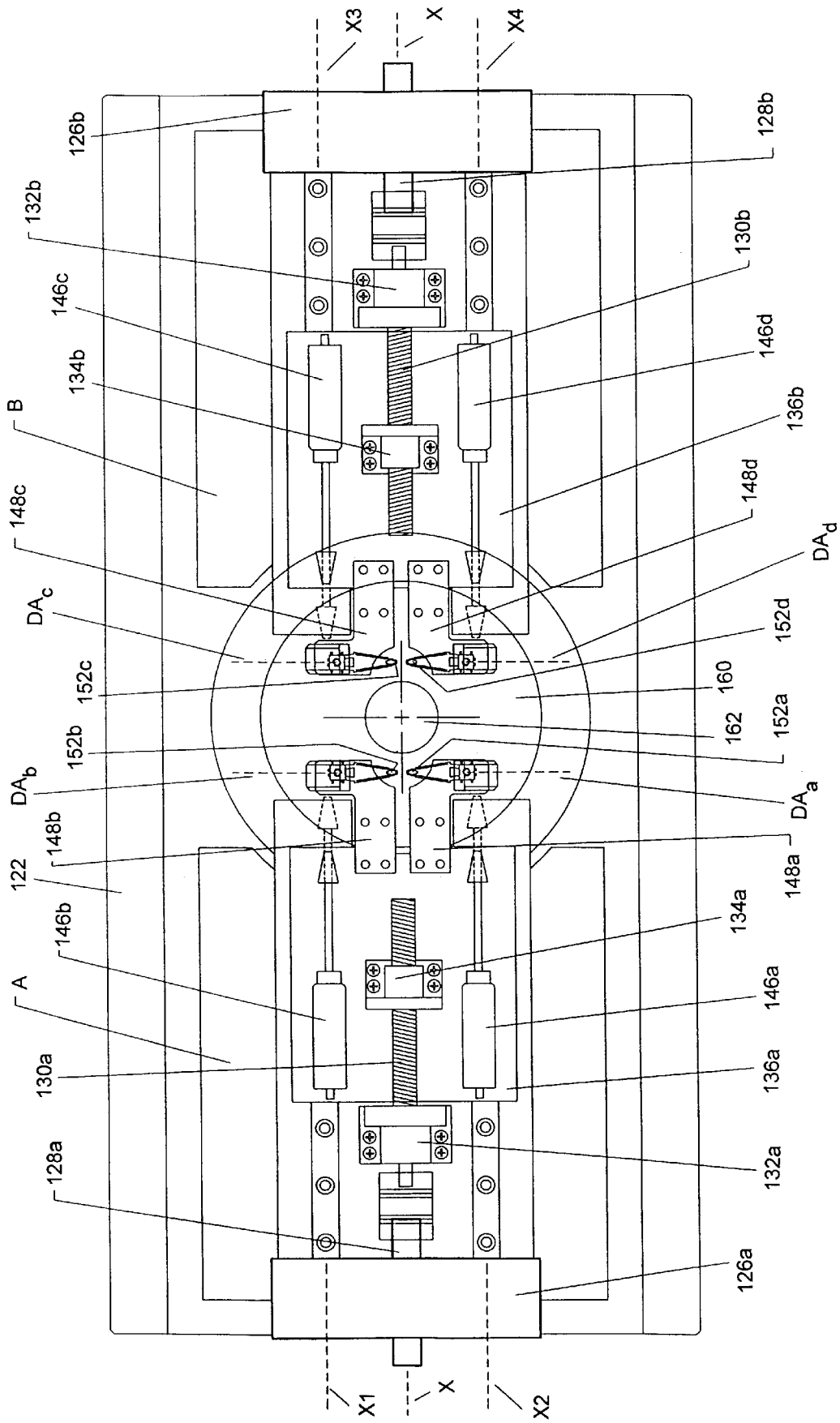
FIG. 2 is a top view of a certifier of the invention.

A disk certifier of the invention is shown in FIG. 2 which is a top schematic view of the certifier. As shown in the drawing, the certifier has a stationary base plate 122 which supports two identical actuators A and B which are arranged diametrically opposite to each other.

Actuator A contains a stepper motor 126a, an output shaft 128a of which is connected to a coaxially-arranged lead screw 130a which rotates in bearings 132a. Lead screw 130a engages a nut 134a which is rigidly fixed to a linear slide 136a. Slide 136a supports head loader mechanism 146a which supports a mounting block 148a and read head 152a, and a head loader mechanism 146b which supports a mounting block 148b and a gliding head 152b. The loader mechanisms are selectively operative to bias their associated heads toward the disk 160, and in the case of the magnetic heads to establish a "flying relationship" where the head resiliently rides on an air cushion between it and the disk surface. In the illustrated configuration, the heads 152a and 152b are rigidly coupled by slide 136a and are movable together, in response to drive motor 126a, along axis X1 and axis X2, respectively, which are parallel to axis X.

Actuator B is identical to actuator A and is arranged diametrically opposite to actuator A. It contains a stepper motor 126b, an output shaft 128b of which is connected to a coaxially-arranged lead screw 130b which rotates in bearings 132b. Lead screw 130b engages a nut 134b which is rigidly fixed to a linear slide 136b. Slide 136b supports head loader mechanism 146c which supports a mounting block 148c and write head 152c, and a head loader mechanism 146d which supports a mounting block 148d and a burnishing head 152d. Construction of actuators A and B is based on standard modules described in the prior art, for example in U.S. Pat. No. 4,902,871 issued in 1990 to Nahum Guzik. With this configuration, the heads 152c and 152d are rigidly coupled by slide 136b and are movable together in response to drive motor 126b, along axis X3 and axis X4, respectively, which are parallel to axis X.

Figure 3:
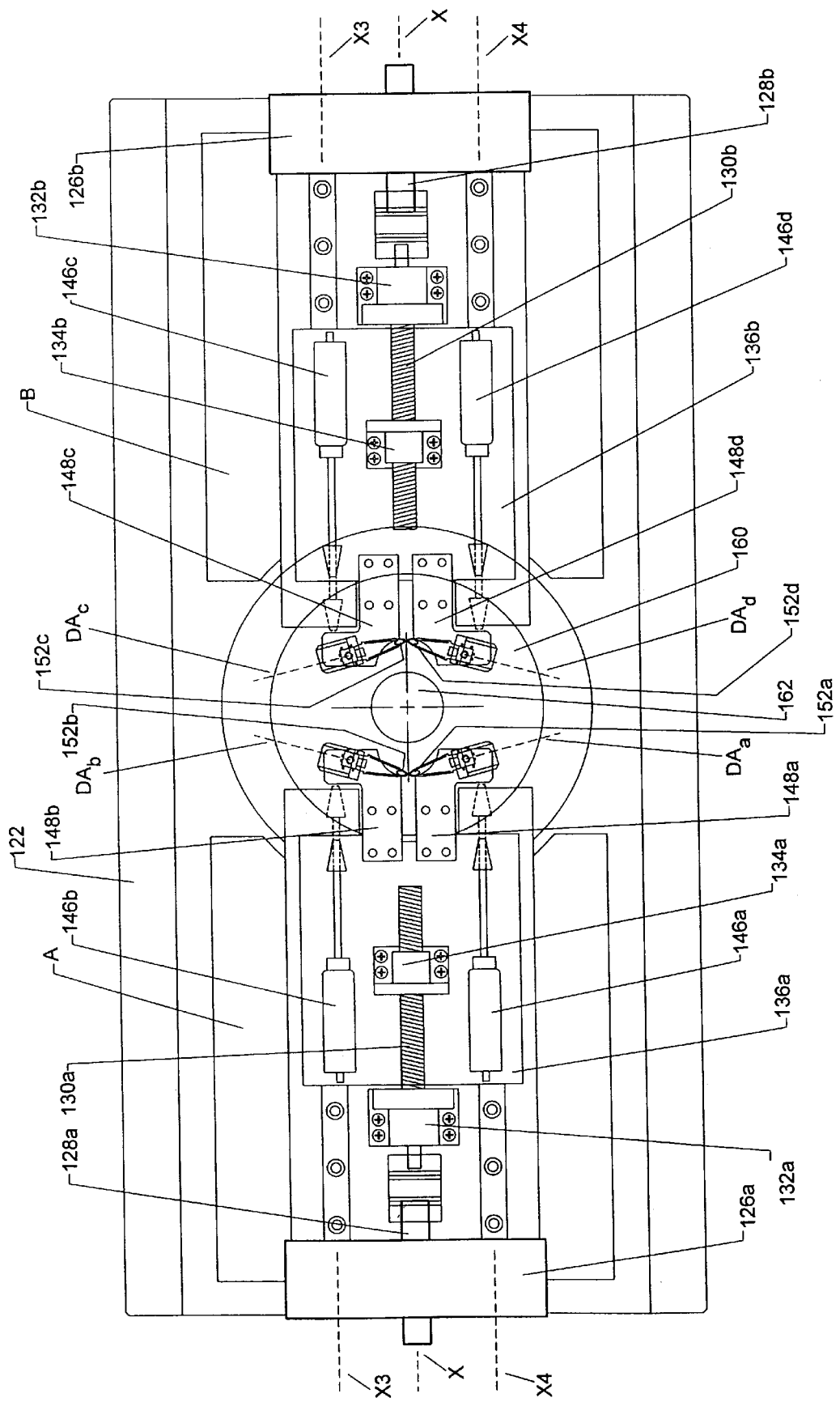
FIG. 3 is a top view of a certifier of the invention with the changed skew angles of the heads.

Each of heads 152a, 152b, 152c, and 152d has an associated directed axis (axes $DA_a$, $DA_b$, $DA_c$, and $DA_d$, respectively, and illustrated by similarly marked axes in FIGS. 2 and 3). In the cases of head 152a and heads 152c, those heads are designed to effect selective reading and writing when those heads are near the underlying portions of disk 160 and those portions are moving in a direction opposite to the respective axes $DA_a$ and $DA_b$. The axes for such heads are referred to as "sensitive" axes since they correspond to the preferred read or write axis for a given head design. In the illustrated embodiment, the gliding head 152b and burnishing head 152d have similar directional preferences. In other embodiments, the write/read functions of heads 152a and 152c may be switched, or heads 152a and 152c may each be read/write (RW) or write/read (WR) heads, and may not have a direction preference. The glide and burnish heads may not have a directional preference.

Figure 2A:
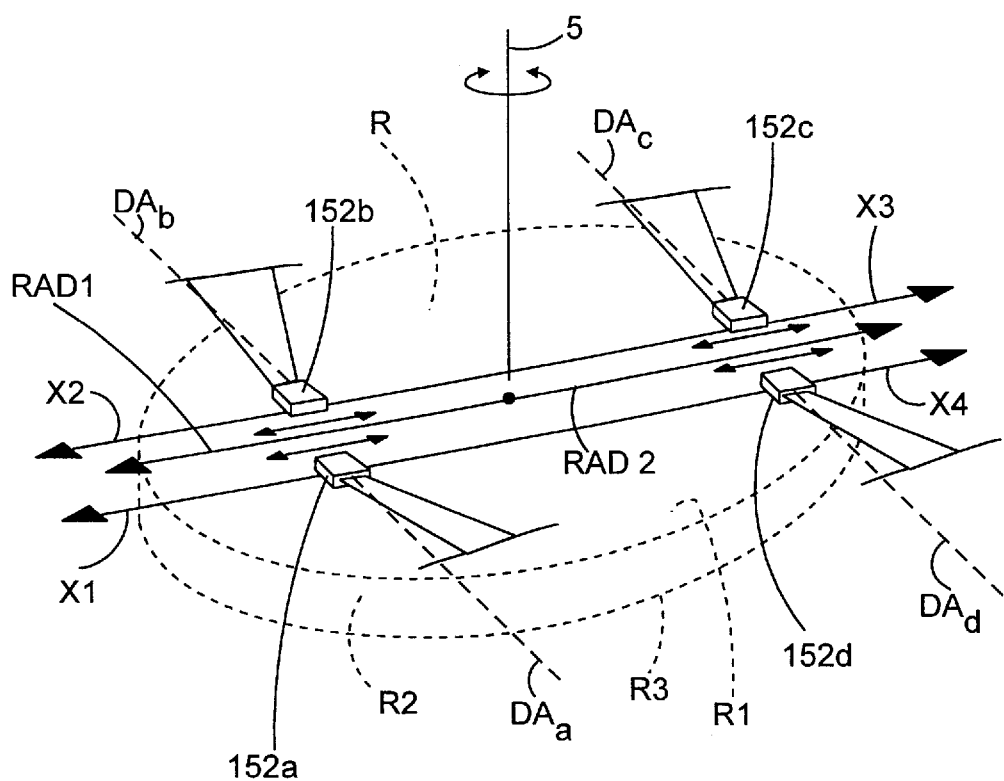
FIG. 2A is a schematic representation of the locus for disk to be processed by the invention, shown relative to the heads of the invention.

FIG. 2A shows a schematic representation of the for heads 152a, 152b, 152c and 152d, positioned in respective loci over a cylindrical locus or R (shown in broken lines), which overlies and is concentric with the spindle about spin axis S. The locus R corresponds in shape to a disk-to-be-tested, and has a circular first boundary surface region, R1, and circular second boundary surface region R2, and a cylindrical lateral surface region R3. The heads 152a, 152b, 152c and 152d are movable in loci extending along a respective one of axes X1, X2, X3 and X4. In the illustrated embodiment, all of axes X1, X2, X3 and X4 are parallel to axis X. Further, axes X1 and X4 and axes X2 and X3 are coaxial and are laterally offset by a distance greater than or equal to zero from oppositely directed radii RAD1 and RAD2 of locus R, extending from the spindle axis S.

As illustrated, in FIG. 2, each of the heads 152a, 152b, 152c and 152d, has its directional axis aligned in about the same direction as the underlying portion of the rotating disk, i.e. at a zero skew angle (or approximately 90 degrees with respect to axis X). In FIG. 3, as noted below, a non-zero skew angle (or other than 90 degrees with respect to axis X) is shown.

In the illustrated embodiment, head assemblies 146a/152a and 146b/152b are rigidly coupled to slide member 136a so that they move in concert in response to a single drive motor 126a. Head assemblies 146c/152c and 146d/152d are similarly configured with respect to slide member 132b and motor 126b. In alternate embodiments, each assembly may be driven by a separate independently controlled drive motor.

Figure 4:
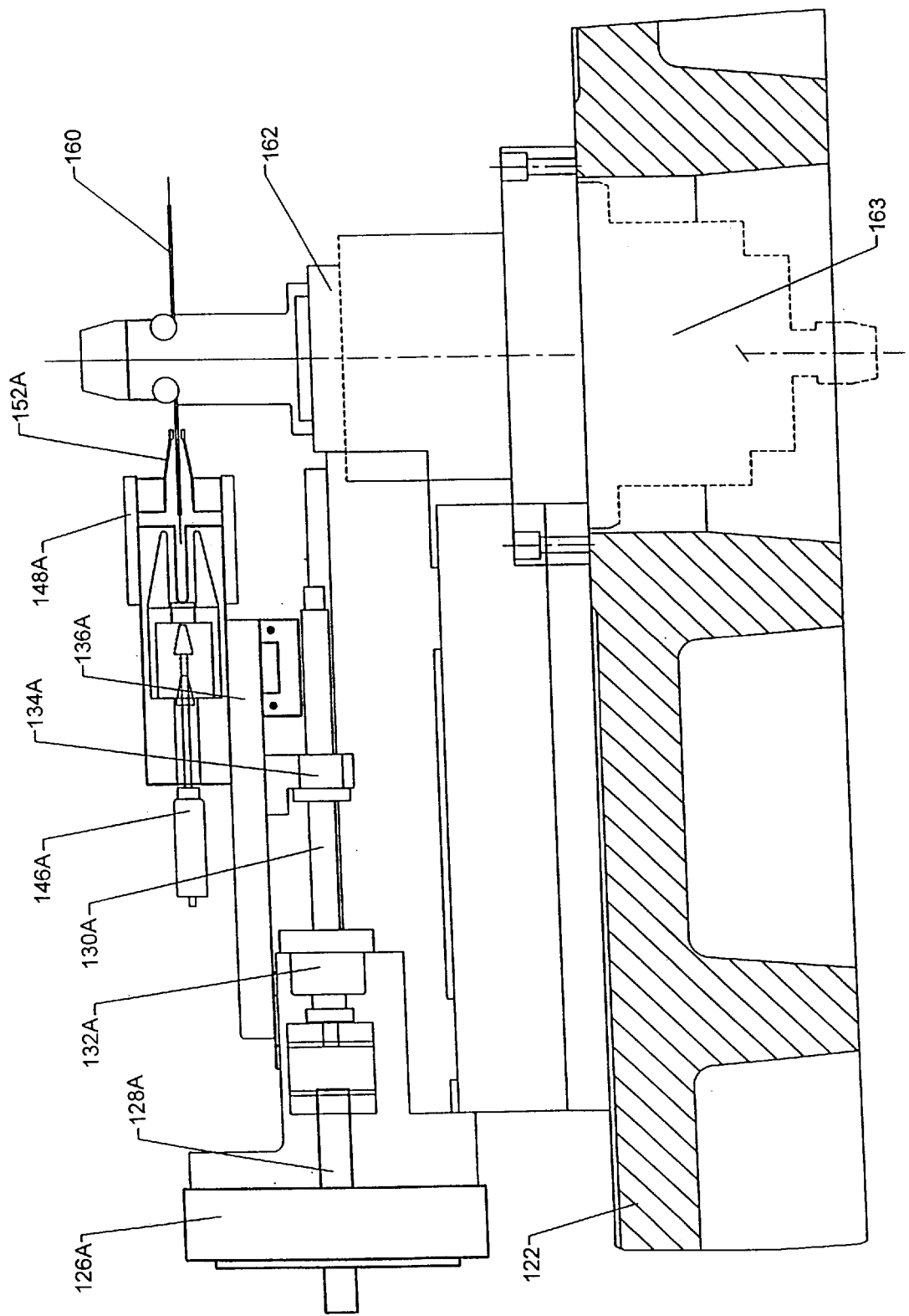
FIG. 4 is a side, partially cross-sectional view of the certifier of FIG. 2, the magnetic heads being shown in different positions.

Heads 152a, 152b, 152c, and 152d are installed over a magnetic disk 160 to be tested. Magnetic disk 160 is supported by a spindle 162. FIG. 4 demonstrates a side, partially sectional view of the certifier. Only one half of the certifier, corresponding to actuator A is shown. As seen from FIG. 4, spindle 162 is rotated by a spindle motor 163. This motor is reversible, rotates with a speed of up to 10000 rpm, and can be stopped and reversed during 2 to 3 seconds. An example of this motor is motor ABT produced by Air Bearing Technology Inc, 2260 American Ave Ste 1, Hayward, Calif. 94545-1815.

To reverse the direction of motor rotation, the direction of DC voltage supplied to a motor has to be reversed. This is done by a switching circuit schematically shown in FIG. 5. The switching circuit has a control unit CU designed for controlling switching of various devices. Motor 163 has a switch 202 with movable contacts 204, 206 connected to a power supply PS and fixed contacts 208, 210, 212 connected to motor 163. Switch 202 has a switch actuator 214 connected to control unit CU. In the position shown in FIG. 5, motor 163 rotates in a direction corresponding to the position of movable contacts 204, 206. When a signal is fed from control unit CU to switch actuator 214, contacts 204/208 are opened and contacts 206/210 are closed to reverse motor 163.

Loading mechanisms 146a, 146b, 146c, 146d are connected to power supply PS through a switch 218. Switch 218 has movable contacts 220, 222, 224, 226 connected to power supply PS and fixed contacts 228, 230, 232, 234 connected to loading mechanisms 146a, 146d, 146b, 146c, respectively. Switch 218 has a switch actuator 236 connected to control unit CU. In the position shown in FIG. 5, loading mechanisms 146a and 146c are connected to power supply PS through closed contacts 220/228 and 226/234. When a signal is fed from control unit CU to switch actuator 236, in connection with the signal fed from control unit CU to switch actuator 214 to reverse motor 163 as described above, contacts 220/228 and 226/234 are opened and contacts 222/230 and 224/232 are closed. This results in loading mechanisms 146a and 146c, being disconnected from power supply PS and loading mechanism 146b and 146d being connected to power supply PS. As a result, respective heads 152a and 152c are unloaded and heads 152b and 152d are loaded.

Actuator stepper motors 126a and 126b are connected to power supply PS through a switch 238 for reversing the stepper motors. Switch 238 has movable contacts 240, 242 and 244, 246 connected to power supply and fixed contacts 248, 250, 252 and 254, 256, 258 connected to stepper motors 126a and 126b, respectively. In the position shown in FIG. 5, contacts 240/248 and 244/254 are closed, and contacts 242/250 and 246/256 are open which corresponds to one direction of rotation of each of stepper motors 126a, 126b. Switch 238 has a switch actuator 260 connected to control unit CU. Following a signal from control unit CU, in connection with the signal fed from control unit CU to switch actuator 236 to switch over loading mechanisms 146a through 146d as described above, contacts 240/248 and 244/254 are opened, and contacts 242/250 and 246/256 are closed. As a result, stepped motors 126a and 126b are reversed.

Figure 5:
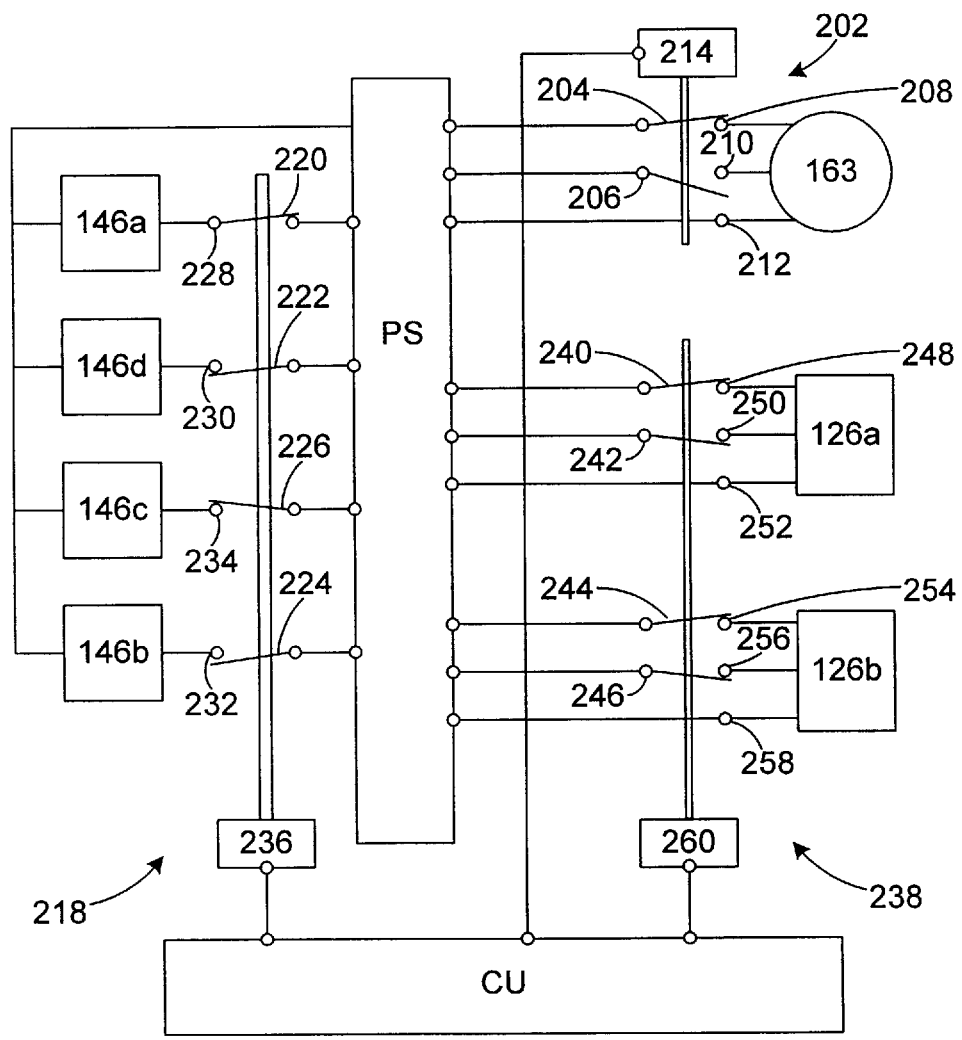
FIG. 5 is an electric circuit for reversing the drive motor of the spindle.

It can be seen from the above description of the switching circuit shown in FIG. 5, that various devices of the disk certifier are switched over in a predetermined pattern to suit the operating mode of the heads, head loading mechanisms and motors. It will be understood that any other sequence of switching and combinations of devices and their groups that are being switched are possible with appropriate changes to the switching circuit shown and described above. It is also understood that operation of control unit CU (which can be built around any appropriate known logic control unit, computer or microprocessor preprogrammed for a predetermined sequence of switching operations) can also involve various time delay values between various switching sequences within each cycle. Such switching circuits are well known to those skilled in the art.

In the preferred mode of operations, all four heads 152a, 152b, 152c and 152d are always positioned at the same radial distance from the center of magnetic disk 160, i.e. at any moment they are located above the same track of the disk.

Actuators A and B move synchronously toward each other for a distance that overlaps all tracks of magnetic disk 160 from its inner diameter ID to its outer diameter OD so that all tracks on the disk medium could be tested.

Reading head 152a and writing head 152c operate when disk rotates in a clockwise direction, while gliding head 152b and burnishing head 152d operate when disk rotates in a counter clockwise direction. The controller CU operates the loaders so that the heads 152a and 152c are loaded (i.e. biased toward disk 160) when the disk rotates in a first direction, and the heads 152b and 152d are loaded when the disk 160 rotates in the opposite direction.

FIG. 3 is identical to FIG. 2 with the only exception that the heads 152a, 152b, 152c and 152d are shown arranged with their directional axes aligned at a certain non-zero angle (A) relative to the perpendicular to the long axis (X) of the certifier. This is done by a manual mechanical adjustment of heads 152, 152b, 152c and 152d relative to their mounting blocks 148a, 148b, 148c and 148d.

The disk certifier shown in FIGS. 2, 4 and 5 operates as follows:

Actuators A and B are first adjusted with the use of stepper motors 126a and 126b, lead screws 130a and 130b and nuts 134a and 134b, respectively, so that slides 136a and 136b position heads 152a, 152b, 152c and 152d above the outermost track (referred to below as track OD) on disk 160.

Heads 152a and 152b are aligned with their respective directional axes directed opposite each other. Similarly, heads 152c and 152d are directed opposite each other. However, the directional axes of the pair of heads 152a and 152c, and those of the pair of heads 152b and 152d, have the same orientation relative to the rotation of the underlying portions of disk 160 and, therefore, these heads can be used in pairs for a given direction of the rotation of disk 160.

Motor 163 begins to rotate spindle 162 with magnetic disk 160, e.g. in a counter clockwise direction. In this mode, gliding head 152b is directed toward the disk using head loading mechanism 146b. As disk rotates, gliding head 152b detects the presence of bumps on track OD using a sensor (not shown). If the bumps are detected (i.e. the magnetic medium on disk 160 extends more than a predetermined distance from a point in a reference plane of the disk), the corresponding track OD is subject to processing using burnishing head 152d that is located on the same track. Burnishing head 152d is directed toward the disk using head loading mechanism 146d and cuts off the bumps.

Such operations of gliding and burnishing are repeated from track to track as actuators A and B move slides 136a and 136b and hence heads 152b and 152d toward each other. During the glide/burnish cycle the read head 152a and writing head 152c remain in unloaded positions.

Upon completion of glide/burnish cycle, motor 163 begins to rotate spindle 162 in a reverse direction, i.e., in a clockwise direction, if one looks at magnetic disk 160 from the top. At this time, heads 152b and 152d are unloaded from the disk by their respective loading mechanisms 146b and 146d, and heads 152a and 152c are directed toward (or loaded on) the disk surface by their loading mechanisms 146a and 146c. Slides 136a and 136b begin to move in diametrically opposite directions. On each track write head 152c writes the information which is then read by read head 152a. If errors or defects are found on the tracks, they are registered with the use of a registration circuit (not shown).

Thus, heads 152b and 152d operate simultaneously during a glide/burnish cycle and heads 152a and 152c operate simultaneously during a write/read cycle. Since these pairs of heads are arranged opposite to each other and in the same direction relative to the rotation of disk 160, each pair of heads operates when disk rotates in the particular (clockwise or counterclockwise) direction. Reversing direction of disk rotation allows switching between glide/burnish and write/read cycles.

If a particular skew angle, i. e., the angle between the directed axes of heads 152a, 152b, 152c and 152d and the direction of an underlying magnetic track is required, the angle can be achieved by a manual mechanical adjustment of heads 152a, 152b, 152c and 152d relative to their mounting blocks 148a, 148b, 148c and 148d. This procedure is well documented in U.S. Pat. No. 4,902,871 issued in 1990 to Nahum Guzik. An exemplary non-zero skew angle is illustrated in FIG. 3.

SUMMARY, RAMIFICATIONS AND SCOPE

Thus it has been shown that the disk certifier described above is compact, small in size, light in weight, less expensive to manufacture.

Although the invention has been described with reference to a specific embodiment, it is understood that it is not limited to the example given and that any other modifications are possible without departure from the scope of the attached claims. For example, the direction of motion of the heads may be other than strictly parallel with the axis X, although a small foot-print system is best achieved with that limitation. Also three or more than four heads can be installed above the magnetic disk. Three or more actuators such as actuators A and B can be used for checking defects of the media and characteristics of the tracks. Each actuator may support one or more than two heads. Heads of types other than gliding, burnishing, writing and reading can be used in the certifier. Skew angles can be adjusted and measured automatically from programmed means during the testing. Each pair of heads can operate alternatively on each track or a selected regions of the medium and sequence of write/read and burnish/glide cycles can be modified.

Therefore, the scope of the invention should be determined, not by the given examples, but by the claims and their legal equivalents.

What is claimed is:

1. Apparatus for testing and processing a planar magnetic disk said disk further having a magnetic storage medium on a principal surface thereof, comprising:

A. a disk support assembly including a spindle for rotatably supporting said magnetic disk about a spindle axis, B. a first magnetic head assembly including a first magnetic head and including means for selectively positioning said first magnetic head along a first head axis overlying said disk to permit selective reading and/or writing information from/to said magnetic storage medium when said spindle rotates in a first direction, and whereby said first magnetic head is at a predetermined angle with respect to said first head axis, C. a second magnetic head assembly including a second magnetic head, and including means for selectively positioning said second magnetic head along a second head axis overlying said disk to permit selective reading and/or writing information from/to said magnetic storage medium when said spindle rotates in said first direction, and whereby said second magnetic head is at a predetermined angle with respect to said second head axis, wherein said second head axis is substantially parallel to said first head axis, D. a gliding head assembly including a gliding head, and including means for selectively positioning said gliding head along a third head axis overlying said disk to permit gliding by said gliding head over said magnetic storage medium when said spindle rotates in a second direction, said second direction being opposite said first direction, wherein said third head axis is substantially parallel to said first head axis, E. a burnishing head assembly including a burnishing head, and including means for selectively positioning said burnishing head along a fourth head axis overlying said disk to permit burnishing of said magnetic storage medium by said burnishing head when said spindle rotates in said second direction, wherein said fourth head axis is substantially parallel to said first head axis, F. a controller including means for selectively driving each of said first magnetic head, said second magnetic head, said gliding head and said burnishing head across said magnetic storage medium and for selectively rotating said spindle in said first and second directions.

2. Apparatus according to claim 1 wherein said predetermined angle is ninety degrees.

3. Apparatus according to claim 1 wherein said predetermined angle is other than ninety degrees.

4. Apparatus according to claim 1 wherein said first magnetic head assembly and said gliding head assembly are rigidly coupled whereby said assemblies move in concert in response to said driving means, and said second magnetic head assembly and said burnishing head are rigidly coupled whereby said assemblies move in concert in response to said driving means.

5. Apparatus according to claim 1 wherein said driving means effects movement of said assemble is successively between points distal to said spindle axis and point proximal to said distal axis.

6. Apparatus according to claim 5 wherein said controller alternately effects rotation of said spindle in said second direction and said first direction, and said movements of said assemblies is effected synchronously with rotation of said spindle in the sequence:

(a) said gliding head assembly and said burnishing head assembly, while said spindle rotates in said second direction, and (b) said first magnetic head assembly and said second magnetic head assembly, while said spindle rotates in said first direction.

7. Apparatus according to claim 4 wherein said driving means effects movement of said assemble is successively between points distal to said spindle axis and point proximal to said distal axis.

8. Apparatus according to claim 7 wherein said controller alternately effects rotation of said spindle in said second direction and said first direction, and said movements of said assemblies is effected synchronously with rotation of said spindle in the sequence:

(a) said gliding head assembly and said burnishing head assembly, while said spindle rotates in said second direction, and (b) said first magnetic head assembly and said second magnetic head assembly, while said spindle rotates in said first direction.

9. Apparatus for testing and processing a planar magnetic disk, said disk having substantially parallel circular first and second surfaces disposed symmetrically about a disk axis, said disk axis being perpendicular to said first and second surfaces, and said disk further having a magnetic storage medium on at least said first surface, comprising:

A. a disk support assembly including a rotatable spindle for supporting said magnetic disk in a locus disposed about a spindle axis with said disk axis being coaxial with said spindle axis, said locus substantially corresponding in shape to the shape of said disk and having a circular first boundary region corresponding in shape and relative position to said first surface of said disk, said spindle being rotatable in each of first and second opposing disk rotation directions about said spindle axis, B. a first magnetic head assembly including a first magnetic head having an associated directed read and/or write (RW) axis, and including means for supporting said first magnetic head in a head locus extending along a first head axis substantially parallel to and laterally offset a distance greater than or equal to zero in a first direction from a first radius of said first boundary region extending from said spindle axis, whereby said first magnetic head overlies and is spaced apart a distance greater than or equal to zero from said first boundary region, and whereby said associated RW axis is directed at least in part in said first disk rotation direction and perpendicular to or skewed by predetermined angle with respect to said first radius, C. a second magnetic head assembly including a second magnetic head having an associated directed RW axis, and including means for supporting said second magnetic head in a head locus extending along a second head axis substantially parallel to and laterally offset a distance greater than or equal to zero in a second direction from a second radius of said first boundary region extending from said spindle axis, whereby said second magnetic head overlies and is spaced apart a distance greater than or equal to zero from said first boundary region, and whereby said associated RW axis is directed at least in part in said first disk rotation direction and is perpendicular to or skewed by a predetermined angle with respect to said second radius, wherein said second radius is coaxial with and oppositely directed to said second radius, D. a gliding head assembly including a gliding head having an associated directed glide axis, and including means for supporting said gliding head in a head locus extending along a third head axis parallel to and laterally offset a distance greater than or equal to zero in said second direction from said first radius of said first boundary region, whereby said glide axis is directed at least in part in said second disk rotation direction and said gliding head overlies and is spaced apart a distance greater than or equal to zero from said first boundary region, E. a burnishing head assembly including a burnishing head having an associated burnish axis, and including means for supporting said burnishing head in a head locus extending along a fourth head axis parallel to and laterally offset a distance greater than or equal to zero in said first direction from second radius of said first boundary region, whereby said burnishing axis is directed at least in part in said second disk rotation direction and said burnish head overlies and is spaced apart a distance greater than or equal to zero from said first boundary region, and F. a controller including means for selectively rotating said spindle in each of two opposite directions about said first axis, and for selectively driving each of said first magnetic head, said second magnetic head, said gliding head, and said burnishing head in said respective loci across said first boundary region from a position distal from said first axis, to a position proximal to said first axis, and back to said position distal from said first axis, or from a position proximal to said first axis, to a position distal from said first axis, and back to a position proximal to said first axis.

10. Apparatus according to claim 9 wherein said first magnetic head is a read head and said second magnetic head is a write head.

11. Apparatus according to claim 10 further comprising:
  (a) selectively operative first drive means for driving said first magnetic head and said gliding head in concert, and
  (b) selectively operative second drive mens for driving said first magnetic head and said burnishing head in concert.

12. Apparatus according to claim 9 wherein said second magnetic head is a read head and said first magnetic head is a write head.

13. Apparatus according to claim 12 further comprising:
  (a) selectively operative second drive means for driving said first magnetic head and said gliding head in concert, and
  (b) selectively operative second drive means for driving said first magnetic head and said burnishing head in concert.

14. Apparatus according to claim 9 wherein said first magnetic head and said second magnetic head are read/write heads.

15. Apparatus according to claim 14 further comprising:
  (a) selectively operative first drive means for driving said first magnetic head and said gliding head in concert, and
  (b) selectively operative second drive mens for driving said second magnetic head and said burnishing head in concert.

16. Apparatus according to claim 14 further comprising:
  (a) selectively operative first drive means for driving said first magnetic head and said burnishing head in concert, and
  (b) selectively operative second drive means for driving said first magnetic head and said gliding head in concert.

17. Apparatus according to claim 9, further comprising:
  i. first head bias means for selectively biasing said first magnetic head toward said first boundary region,
  ii. second head bias means for selectively biasing said second magnetic head toward said first boundary region,
  iii. glide bias means for selectively biasing said gliding head toward said first boundary region, and
  iv. burnish bias means for selectively biasing said burnishing head toward said first boundary region.

18. Apparatus according to claim 17 wherein said second magnetic head is a read head and said first magnetic head is a write head.

19. Apparatus according to claim 18 further comprising:
  (a) selectively operative first drive means for driving said first magnetic head and said gliding head in concert, and
  (b) selectively operative second drive mens for driving said second magnetic head and said burnishing head in concert.

20. Apparatus according to claim 19 wherein said controller includes means for operating in sequence:
  i. said first drive means and said glide bias means and said second drive means and said burnish bias means, while rotating said spindle in said second disk rotation direction, and
  ii. said second drive means and said second head bias means and said first drive means and said first head bias means, while rotating said spindle in said first disk rotation direction.

21. Apparatus according to claim 17 wherein said first magnetic head is a read head and said second magnetic head is a write head.

22. Apparatus according to claim 21 further comprising:
  (a) selectively operative second drive means for driving said first magnetic head and said gliding head in concert, and
  (b) selectively operative second drive mens for driving said first magnetic head and said burnishing head in concert.

23. Apparatus according to claim 22 wherein said controller includes means for operating in sequence:
  i. said first drive means and said glide bias means and said second drive means and said burnish bias means, while rotating said spindle in said second disk rotation direction, and
  ii. said first drive means and said first head bias means, and said second drive means and said second head bias means, while rotating said spindle in said first disk rotation direction.

24. Apparatus according to claim 17 wherein said first magnetic head is a read/write (RW) head and said second magnetic head is a write/read (WR) head.

25. Apparatus according to claim 24 further comprising:
  (a) selectively operative first drive means for driving said first magnetic head and said gliding head in concert, and
  (b) selectively operative second drive mens for driving said second magnetic head and said burnishing head in concert.

26. Apparatus according to claim 25 wherein said controller includes means for operating in sequence:
  i. said first drive means and said glide bias means and said second drive means and said burnish bias means, while rotating said spindle in said second disk rotation direction, and
  ii. said second drive means and said second head bias means, and said first drive means and said first head bias means while rotating said spindle in said first disk rotation direction.

27. Apparatus according to claim 10 further comprising independently operable:
  i. first drive means for driving said first magnetic head,
  ii. second drive means for driving said second magnetic head, iii. third drive means for driving said gliding head, and
iv. fourth drive means for driving said burnishing head.

28. Apparatus according to claim 27 wherein said controller further includes means for operating in sequence:
   i. said third drive means and said fourth drive means, while rotating said spindle in said second disk rotation direction, and
   ii. said second drive means and said first drive means, while rotating said spindle in said first disk rotation direction.

29. Apparatus according to claim 11 further comprising independently operable:
   i. first drive means for driving said first magnetic head,
   ii. second drive means for driving said second magnetic head,
   iii. third drive means for driving said gliding head, and
   iv. fourth drive means for driving said burnishing head.

30. Apparatus according to claim 29 wherein said controller further includes means for operating in sequence:
   i. said third drive means and said fourth drive means, while rotating said spindle in said second disk rotation direction, and
   ii. said first drive means, and said second drive means, while rotating said spindle in said first disk rotation direction.

31. Apparatus according to claim 17 further comprising independently operable:
   i. first drive means for driving said first magnetic head,
   ii. second drive means for driving said second magnetic head,
   iii. third drive means for driving said gliding head, and
   iv. fourth drive means for driving said burnishing head.

32. Apparatus according to claim 31 wherein said first magnetic head is a read head and said second magnetic head is a write head.

33. Apparatus according to claim 32 wherein said controller further includes means for operating in sequence:
   i. said third drive means and said glide bias means and said fourth drive means and said burnish bias means, while rotating said spindle in said second disk rotation, and
   ii. said second drive means and said second head bias means, and said first drive means and said first head bias means while rotating said spindle in said first disk rotation direction.

34. Apparatus according to claim 31 wherein said second magnetic head is a read head and said first magnetic head is a write head.

35. Apparatus according to claim 33 wherein said controller further includes means for operating in sequence:
   i. said third drive means and said glide bias means and said fourth drive means and said burnish bias means, while rotating said spindle in said second disk rotation direction,
   ii. said first drive means and said first head bias means and said second drive means and said second head bias means, while rotating said spindle in said first disk rotation direction.

36. Apparatus according to claim 31 wherein said first magnetic head is a read/write (RW) head and said second magnetic head is a write/read (WR) head.

37. Apparatus according to claim 36 wherein said controller further includes means for operating in sequence:
   i. said third drive means and said glide bias means and said fourth drive means and said burnish bias means, while rotating said spindle in said second disk rotation, and
   ii. said second drive means and said second head bias means, and said first drive means and said first head bias means while rotating said spindle in said first disk rotation direction.

38. Apparatus according to claim 11 wherein
   i. said first head and said gliding head are mutually coupled by a rigid coupler, and a single driver corresponds to said first head drive means and said glide drive means, and
   ii. said second head and said burnishing head are mutually coupled by a rigid coupler and a single driver corresponds to said second head drive means and said burnish drive coupler.

39. Apparatus according to claim 13 wherein
   i. said first head and said gliding head are mutually coupled by a rigid coupler, and a single driver corresponds to said first head drive means and said glide drive means, and
   ii. said second head and said burnishing head are mutually coupled by a rigid coupler and a single driver corresponds to said second head drive means and said burnish drive coupler.

40. Apparatus according to claim 9 wherein said sensitive axes of said first and second heads are both perpendicular to said first radius.

41. Apparatus according to claim 9 wherein said sensitive axes of said first and second heads are skewed by the same angle (A) with respect to said first radius.

42. Apparatus according to claim 9 wherein said gliding head includes selectively operable means for identifying points on said disk wherein the magnetic medium under said gliding head extends more than a predetermined distance from a reference point in said disk locus.

43. Apparatus according to claim 9 wherein said burnishing head includes selectively operable means for removing portions of said magnetic medium under said burnishing head which extend more than a predetermined distance beyond a reference point in said disk locus.

* * * * *